United States Patent
Song et al.

(10) Patent No.: US 10,078,503 B2
(45) Date of Patent: Sep. 18, 2018

(54) METHOD FOR CREATING PROTOTYPE

(71) Applicant: STUDIO XID KOREA, INC., Seoul (KR)

(72) Inventors: Jae Won Song, Seoul (KR); Soo Kim, Hwaseong-si (KR)

(73) Assignee: STUDIO XID KOREA, INC., Seoul (KR)

( * ) Notice: Subject to any disclaimer, the term of this patent is extended or adjusted under 35 U.S.C. 154(b) by 0 days.

(21) Appl. No.: 15/380,673

(22) Filed: Dec. 15, 2016

(65) Prior Publication Data

US 2017/0337046 A1    Nov. 23, 2017

(30) Foreign Application Priority Data

May 17, 2016  (KR) ........................ 10-2016-0060389

(51) Int. Cl.
| | |
|---|---|
| *G06F 8/38* | (2018.01) |
| *G06F 11/30* | (2006.01) |
| *G06F 3/0482* | (2013.01) |
| *G06F 3/0484* | (2013.01) |

(52) U.S. Cl.
CPC ............ *G06F 8/38* (2013.01); *G06F 11/30* (2013.01); *G06F 3/0482* (2013.01); *G06F 3/04847* (2013.01)

(58) Field of Classification Search
CPC .......... G06F 11/3684; G06F 8/20; G06F 8/34; G06F 17/5009; G06F 17/5081
See application file for complete search history.

(56) References Cited

U.S. PATENT DOCUMENTS

| | | | |
|---|---|---|---|
| 2014/0033084 A1* | 1/2014 | Eismann | G06F 8/38 715/763 |
| 2014/0033087 A1* | 1/2014 | Jaramillo | G06F 8/38 715/764 |
| 2016/0054981 A1* | 2/2016 | Cao | G06F 8/34 717/109 |

(Continued)

FOREIGN PATENT DOCUMENTS

| | | |
|---|---|---|
| KR | 10-2011-0123244 A | 11/2011 |
| WO | 2010/096235 A2 | 8/2010 |

OTHER PUBLICATIONS http://ym7596.blog.me/220608243430, Feb. 2, 2016, total 16 pages.

(Continued)

*Primary Examiner* — Justin S Lee
(74) *Attorney, Agent, or Firm* — Studebaker & Brackett PC

(57) ABSTRACT

Disclosed are methods and programs for creating a prototype, the methods includes at least: receiving a selection of a first trigger, which is a condition for outputting a specific response, in a prototype execution terminal through a prototype creation interface, receiving a selection of a 1-1st response of the first trigger through the prototype creation interface, wherein the 1-1st response is an output driven by the prototype execution terminal when a trigger is generated, receiving an input of a timeline of the 1-1st response through the prototype creation interface, and firstly displaying the first trigger, the 1-1st response, and the timeline of the 1-1st response adjacent to each other through the prototype creation interface.

12 Claims, 13 Drawing Sheets

(56) References Cited

U.S. PATENT DOCUMENTS

2016/0098250 A1* 4/2016 Gross ................. G06F 8/20
                                                    717/109

OTHER PUBLICATIONS

Office Action dated Jun. 16, 2016 from KIPO in connection with the counterpart Korean patent application No. 10-2016-0060389, Total 12 pages.
Korean Office Action dated Feb. 20, 2017 corresponding to Korean Application No. KR 10-2017-0011759.
http://mijin_1230.blog.me/140113503961, Aug. 25, 2010, total 12 pages.

* cited by examiner

METHOD FOR CREATING PROTOTYPE

CROSS-REFERENCE TO RELATED APPLICATION

This application claims priority from Korean Patent Application No. 10-2016-0060389 filed on May 17, 2016, in the Korean Intellectual Property Office, the disclosure of which is incorporated herein by reference in its entirety.

BACKGROUND

1. Technical Field

The present inventive concept relates to a method for creating a prototype. More particularly, the present inventive concept relates to a method for creating a prototype, in which a trigger responsible for a state and a response applied to a layer are organically combined through a timeline so as to enable parallel processing of multiple input signals, and operating timing of the response is intuitively and accurately controlled.

2. Description of the Related Art

Recently, much effort has been devoted to a graphic user interface (GUI) design by producers of applications to be installed in smart devices so as to increase user convenience and intuition, and a variety of prototypes are produced to test convenience and intuition before actual applications are released into a marketplace.

In a conventional prototype production process, a designer creates a GUI design with the designer's idea in documents such as Power Point document and explains the design to a programmer, and the programmer then actually implements the GUI design understood by the programmer so as to produce a prototype. However, a problem with this process is that the idea of the designer is not correctly conveyed to the programmer, and the programmer also implements the GUI design on the basis of his/her own understanding, which may cause a difference between the finally produced prototype and the designer's idea, thus frequently requiring rework.

A prototyping tool has been proposed to solve the problems in conventional methods for producing a prototype. The prototyping tool is a program tool that has preset therein various responses applied to a GUI design so as to produce a prototype without necessitating programmer participation, and this prototyping tool enables designers or general users who are not skilled in programming but well-acquainted with methods of use to quickly and easily produce a prototype.

The prototyping tool has a state method and a timeline method, each having advantages and disadvantages. Specifically, the state method has advantages of receiving and processing a plurality of user inputs simultaneously, but disadvantages in that a response which is being converted cannot be delicately adjusted during a plurality of states are converted. Meanwhile, the timeline method has advantages in that a response converted in the middle can be delicately adjusted when a plurality of states are converted, but disadvantages in that a plurality of user inputs cannot be received and processed simultaneously. Therefore, an urgent need exists to solve the disadvantages of the state method and the timeline method in that a response converted in the middle cannot be delicately adjusted when a plurality of states are converted and a plurality of user inputs cannot be received and processed simultaneously.

SUMMARY

An embodiment of the present disclosure provides a method in which responses converted in the middle are delicately adjusted when a plurality of states are converted, thereby easily identifying an organic change between the responses.

Another embodiment of the present disclosure provides a method in which a plurality of user inputs are received and processed simultaneously, thereby intuitively and accurately adjusting operating timing of responses.

However, embodiments of the present disclosure are not restricted to those set forth herein. The other embodiments of the present disclosure which are not mentioned herein will become more apparent to one of ordinary skilled in the art to which the present disclosure pertains by referencing the detailed description of the present disclosure given below.

According to the present disclosure, responses converted in the middle are delicately adjusted when a plurality of states are converted, thereby providing an effect of easily identifying an organic change between the responses.

Furthermore, a plurality of user inputs are received and processed simultaneously, thereby providing an effect of intuitively and accurately adjusting operating timing of responses.

However, effects of the present disclosure are not restricted to the exemplary embodiments set forth herein and more diverse effects can be included within the scope apparent to one of ordinary skilled in the art from the description given below.

According to some embodiments of the present disclosure, a prototype creation method is provided, the method comprises receiving a selection of a first trigger, which is a condition for outputting a specific response, in a prototype execution terminal through a prototype creation interface, receiving a selection of a 1-1st response of the first trigger through the prototype creation interface, wherein the 1-1st response is an output driven by the prototype execution terminal when a trigger is generated, receiving an input of a timeline of the 1-1st response through the prototype creation interface, and firstly displaying the first trigger, the 1-1st response, and the timeline of the 1-1st response adjacent to each other through the prototype creation interface.

According to some embodiments of the present disclosure, a computer program coupled to a computing device to execute a prototype creation method and stored in a non-transitory computer readable recording medium is provided, =the program being configured to execute an operation of receiving a selection of a first trigger, which is a condition for outputting a specific response, in a prototype execution terminal through a prototype creation interface, an operation of receiving a selection of a 1-1st response of the first trigger through the prototype creation interface, wherein the 1-1st response is an output driven by the prototype execution terminal when a trigger is generated, an operation of receiving an input of a timeline of the 1-1st response through the prototype creation interface, and an operation of displaying the first trigger, the 1-1st response, and the timeline of the 1-1st response adjacent to each other through the prototype creation interface.

DETAILED DESCRIPTION OF THE EMBODIMENTS

Figure 1:
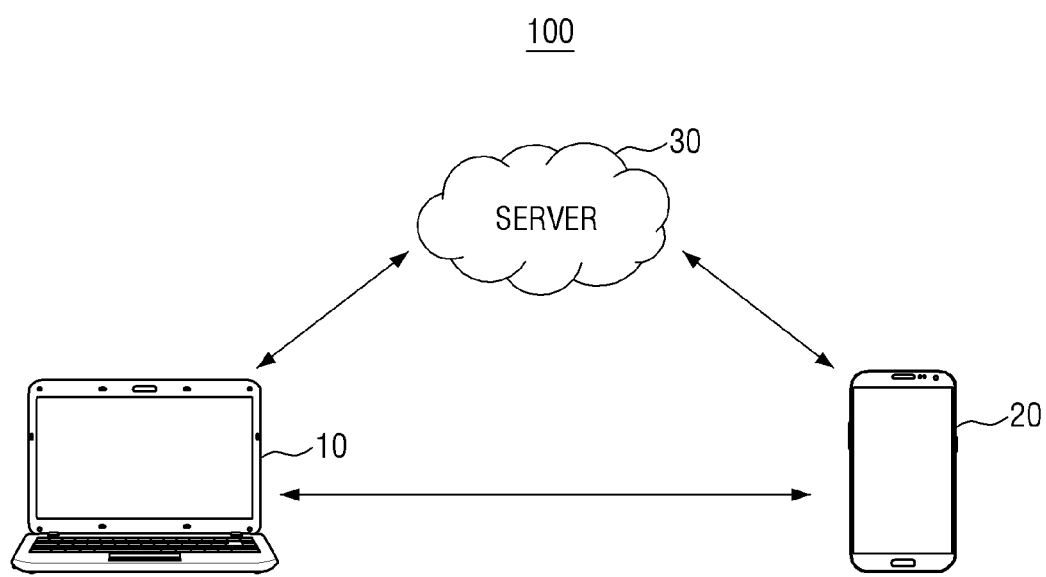
FIG. 1 illustrates a prototype creation system for performing a prototype creation method according to an embodiment of the present inventive concept.

Embodiments of the present inventive concept will hereinafter be described in detail with reference to the attached drawings. The advantages and features of the present inventive concept and methods for accomplishing the same will become apparent by referring to the preferred embodiments thereof described below with reference to the attached drawings. The present inventive concept may, however, be embodied in different forms and should not be construed as limited to the embodiments set forth herein. Rather, these embodiments are provided so that this disclosure will be thorough and complete, and the present inventive concept will be defined by the scope of claims. Throughout the description, identical reference numerals are used to designate identical elements.

Unless defined otherwise, all terms (including technical and scientific terms) used herein have the same meaning as commonly understood by one of ordinary skill in the art to which the present inventive concept belongs. Further, unless expressly defined otherwise, all terms defined in generally used dictionaries may not be interpreted in an idealized or overly sense. It will also be understood that the terms may be used herein to describe embodiments, and may not intended to limit the scope of the present disclosure. As used herein, the singular forms are intended to include the plural forms as well, unless the context clearly indicates otherwise.

The term "layer" as used herein may mean a specific area of an object which can be visually output, such as an image, picture, and the like to which a trigger and a response included in the trigger are applied. For example, one image can be divided into a top part which is a top layer, an intermediate part which is an intermediate layer, and a bottom part which is a bottom layer, and other specific area can be divided as a layer by a user.

The term "trigger" as used herein may mean a condition under which a prototype execution terminal 20 outputs a specific response. For example, the trigger may include a touch input inputted to the execution terminal by a user, information received a sensor and the like, information on a specific state of the execution terminal, and the like.

Furthermore, the term "response" as used herein may mean all types of outputs driven by the prototype execution terminal 20 upon occurrence of a trigger. For example, the response may include a change (rotation, movement, transparency) of an object on a display of the execution terminal, a sound output, a vibration, and the like.

A prototype creation system 100 which can carry out the prototype creation method according to an embodiment of the present inventive concept will be described first with reference to FIG. 1. The prototype creation system 100 according to an embodiment of the present inventive concept may include a prototype creation terminal 10 and a prototype execution terminal 20, and may further a separate server 30.

The prototype creation terminal 10 and the prototype execution terminal 20 may be computing devices which can be interconnected through a network. The network may include both wired and wireless networks such as LAN, WIFI, BLUETOOTH, and Zigbee, and the computing device may include devices having a network function, such as a desktop PC, a notebook, a smart phone, PDA, and a table PC.

The prototype creation terminal 10 may store therein a prototyping tool for performing the prototype creation method according to an embodiment of the present inventive concept. The prototyping tool may be a kind of software, and a creating tool for supporting a prototype creation activity of a user. A prototype creation interface 40 may execute when the prototyping tool is executed through the prototype creation terminal 10 by the user, a prototype may be generated through a predetermined pressure, and the generated prototype may be executed in the prototype execution terminal 20. That is, the prototype creation terminal 10 may generate a prototype through the prototype creation interface, and the prototype execution terminal 20 may execute the generated prototype.

Furthermore, the prototype creation terminal 10 may upload the generated prototype to a server 30 which the prototype execution terminal 20 connects to download the prototype, and the server 30 may be an independent server operated by a creator of the prototyping tool or a cloud server operated by a third party.

The server 30 may have independent storage spaces for the respective prototype execution terminals 20 of users, and store therein the generated prototypes in a cumulative manner, and the generated prototypes may be naturally distributed as the prototype execution terminal 20 downloads uploaded prototypes.

The prototype creation method according to an embodiment of the present inventive concept will now be described with reference to FIG. 2 to FIG. 8 on the basis of the configuration of the prototype creation system 100 described above.

Figure 2:
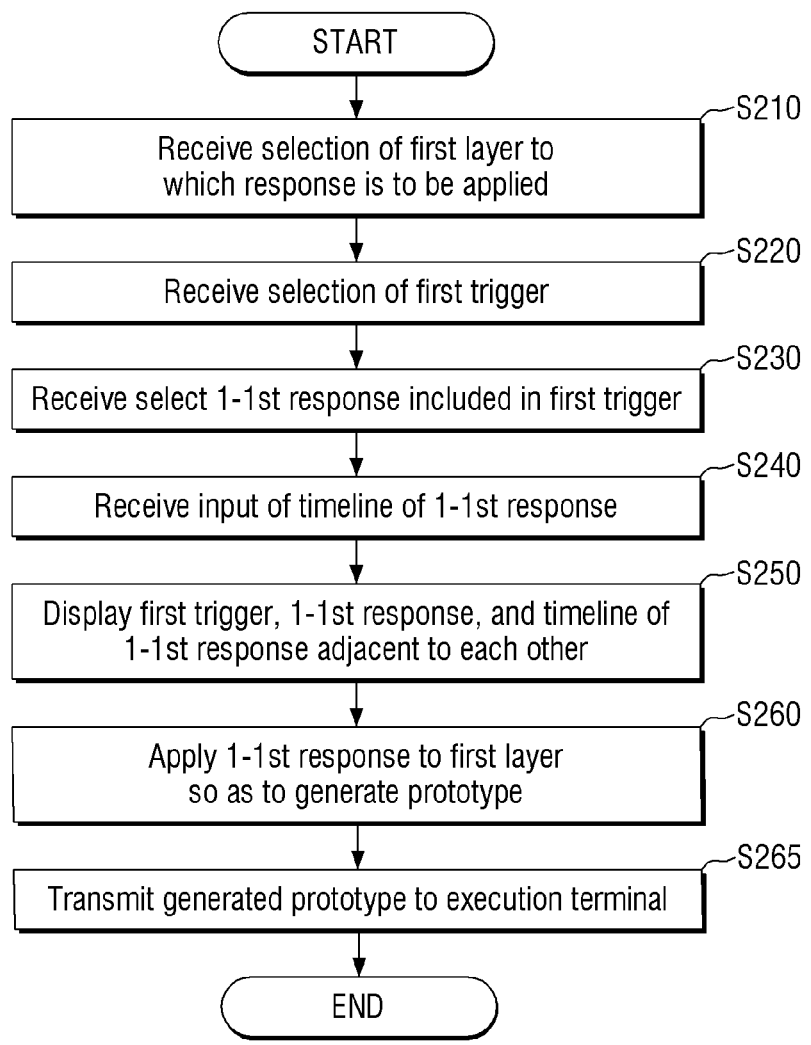
FIG. 2 is a flow diagram illustrating the prototype creation method according to an embodiment of the present inventive concept.

FIG. 2 is a flow diagram illustrating the prototype creation method according to an embodiment of the present inventive concept. However, the embodiment described with reference to FIG. 2 is merely a preferred exemplary embodiment for accomplishing the object of the present inventive concept, and a part of steps may be added or deleted as needed.

First, a first layer 50 to which a response is to be applied is selected in the prototype creation terminal 10 through the prototype creation interface 40 (S210). The first layer 50 may be a specific area of an image or a picture to which a user applies a response.

Figure 3:
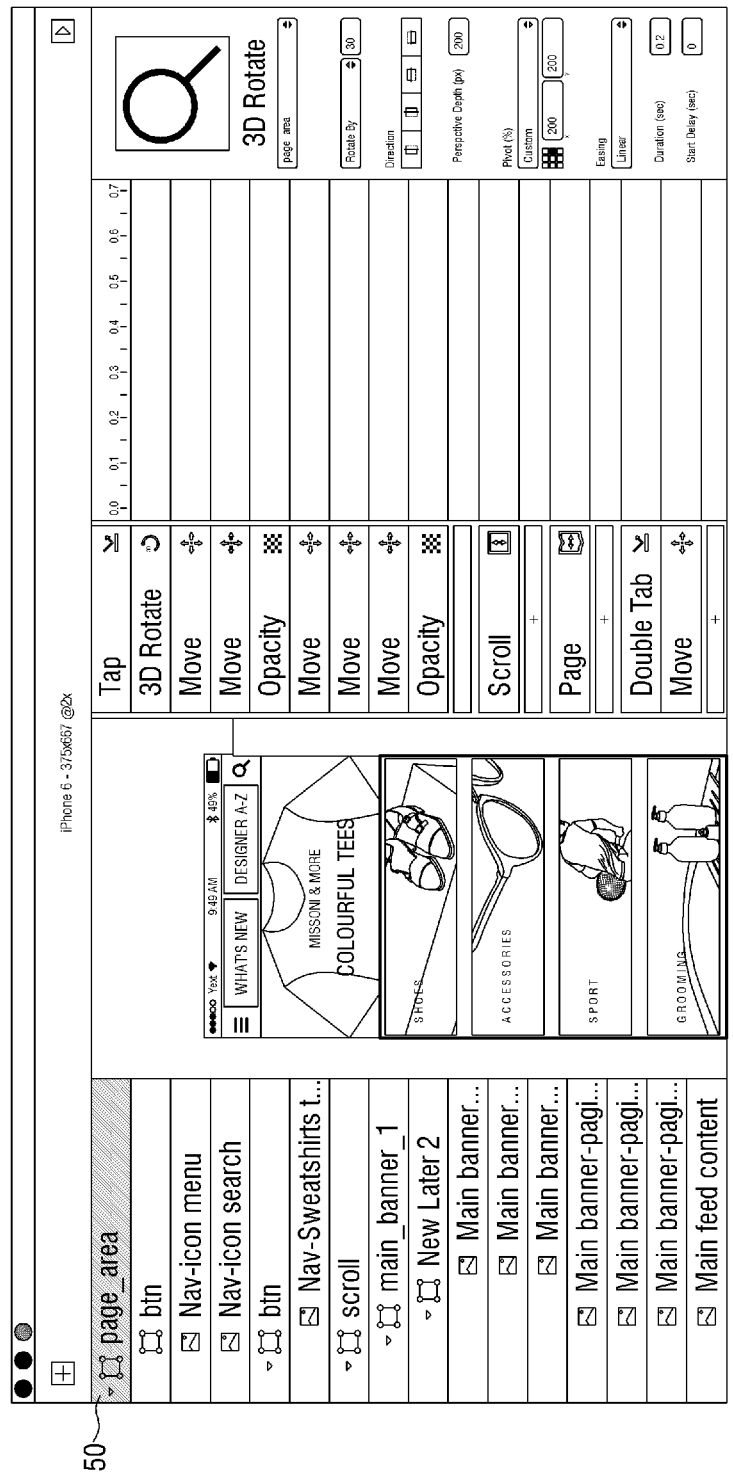
FIG. 3 illustrates selecting a first layer.

The prototype creation interface 40 may automatically divide the image, the picture, and the like input by the user into first to Nth (N is a positive integer) layers, and the user may select any one of the divided layers as the first layer 50. Referring to FIG. 3, "page_area" is selected in a left bar on a screen, and an area corresponding to "page_area" is marked with a thick line, and in this case, the selected "page_area" may be the first layer 50.

The prototype creation interface 40 may automatically divide into first to Nth layers, but the divided layers may not conform to the user's intention. For example, the user may intend to reduce the area of the top layer divided by the prototype creation interface 40, or increase the area of the intermediate layer. In this case, the user may divide into layers by himself, for example, the user may drag a specific area of an image through the use of input means such as a mouse so as to input the dragged area as a desired layer, and the inputted layer may become the first layer 50. Furthermore, an independent title for the first layer 50 input by the user may be also input through the prototype creation interface.

When the first layer 50 is selected, a first trigger 60, which is a condition for outputting a specific response by the prototype execution terminal 20, may be selected in the prototype creation terminal 10 through the prototype creation interface 40 (S220). The prototype creation interface 40 may be provided with a plurality of predefined triggers, and referring to FIG. 4, triggers such as "Tap", "Scroll", "Page", and "Chain" are displayed on the right side of the screen. The triggers are indicators showing a state method. Therefore, a plurality of user inputs may be received and processed simultaneously through the triggers, which is the advantage of the state method.

Meanwhile, the selected trigger may enumerate responses included therein below the trigger in a vertical direction, and referring to FIG. 4, "Tap" trigger is selected. In this case, the "Tap" trigger may be the first trigger 60.

When the first trigger 60 is selected, a 1-1st response 61 included in the first trigger 60 may be selected in the prototype creation terminal 10 through the prototype creation interface 40 (S230). The –1st response may be an output driven by the prototype execution terminal 20 upon occurrence of a trigger, and like the trigger, the prototype creation interface 40 may have a plurality of predefined responses. Referring to FIG. 4, responses such as "3D Rotate", "Move", and "Opacity" are displayed below the Tap trigger on the right side of the screen, and like the trigger, the responses also are indicators showing a state method. Thus, a plurality of user inputs may be received and processed simultaneously through the responses, which is the advantage of the state method.

Figure 4:
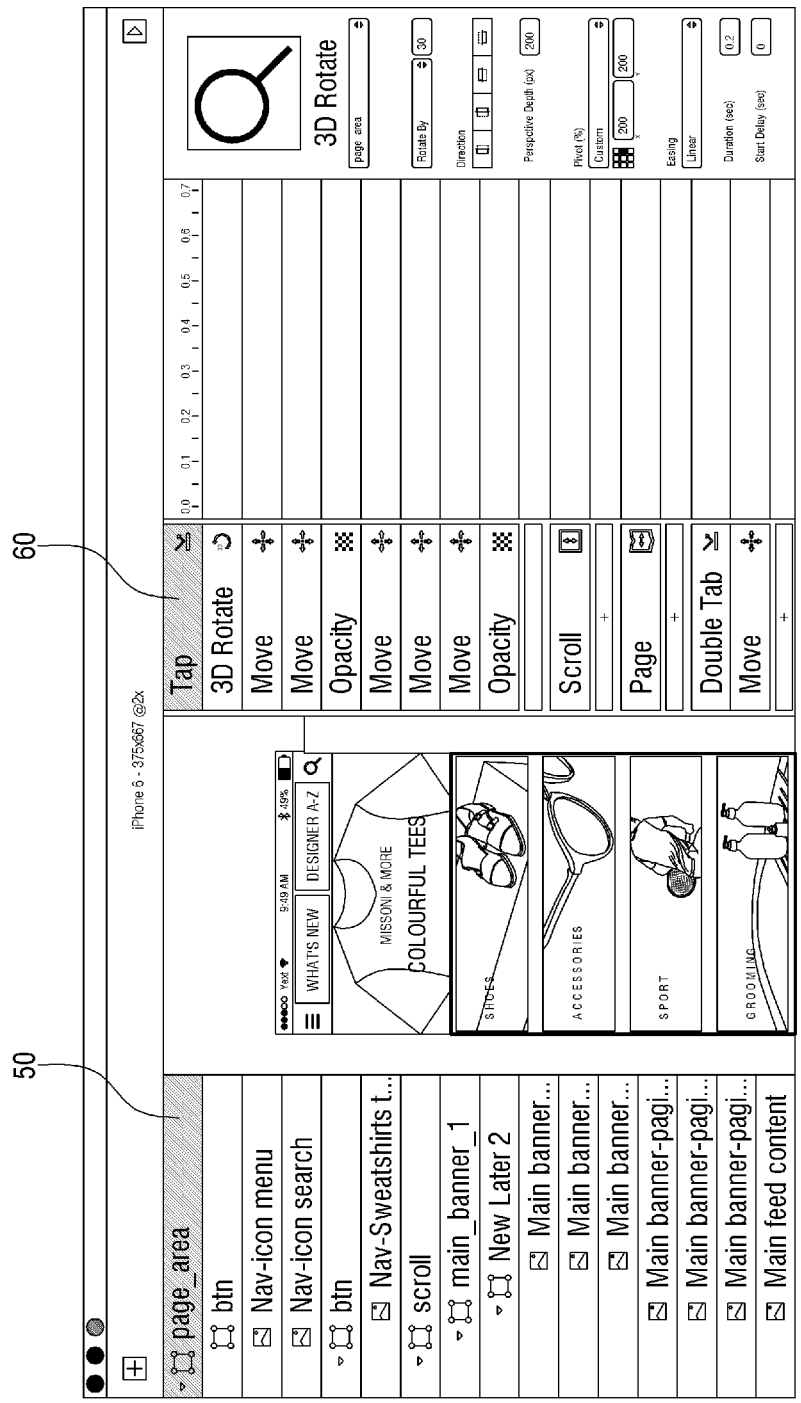
FIG. 4 illustrates selecting a trigger.

Referring to FIG. 4, responses, which the user intends to apply to the first layer 50, are enumerated from the top in order of "3D Rotate"-"Move"-"Move"-"Opacity"-"Move"-"Move"-"Move"-"Move"-"Opacity"-"Opacity"-"Opacity", and one of those responses may be the 1-1st response 61. Specifically, the 1-1st response 61 may mean a response to which a timeline of the response is to be input, which will be described later.

When the response 51 is selected, a timeline of the 1-1st response 61 may be input to the prototype creation terminal 10 through the prototype creation interface 40 (S240). The prototype creation interface 40 may have predefined time tables at sides of each response thereof, and Referring to FIG. 4, a time table from 0.0 to 0.7 at an interval of 0.1 (sec) is displayed at the right sides of responses on the right side of the screen. In this case, 0.7 is merely a limit point indicating a one-time display limit, and subsequent times may be marked rightwards from 0.7. This timeline input makes the prototype creation method according to an embodiment of the present inventive concept become a timeline method, and thus a response converted in the middle can be delicately adjusted when a plurality of states are converted, which is the advantage of the timeline method.

Figure 5:
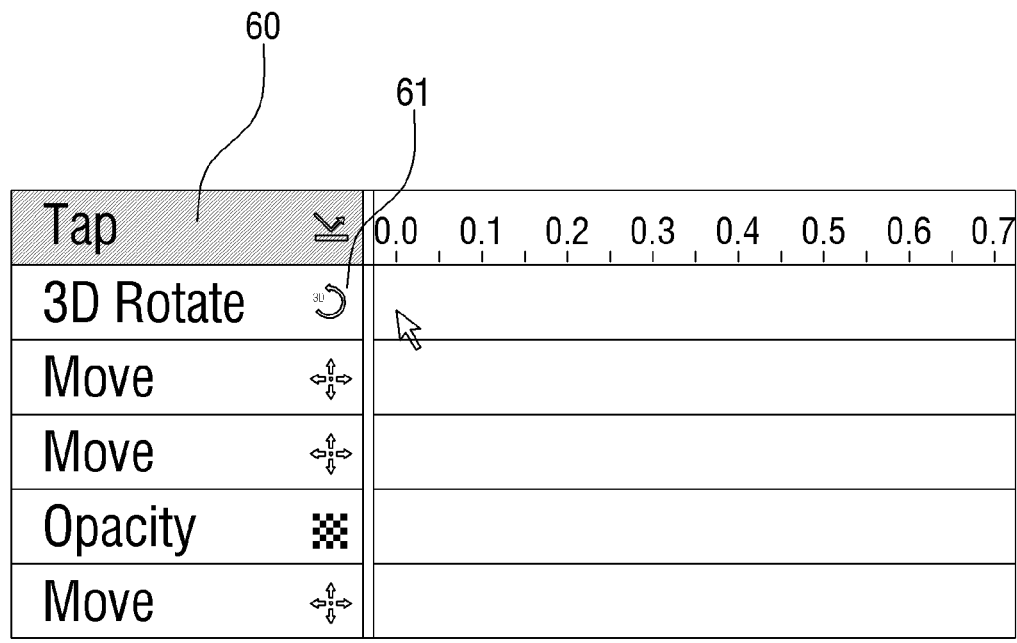
FIG. 5 to FIG. 8 illustrate inputting a timeline of a response through inputting means.
Figure 6:
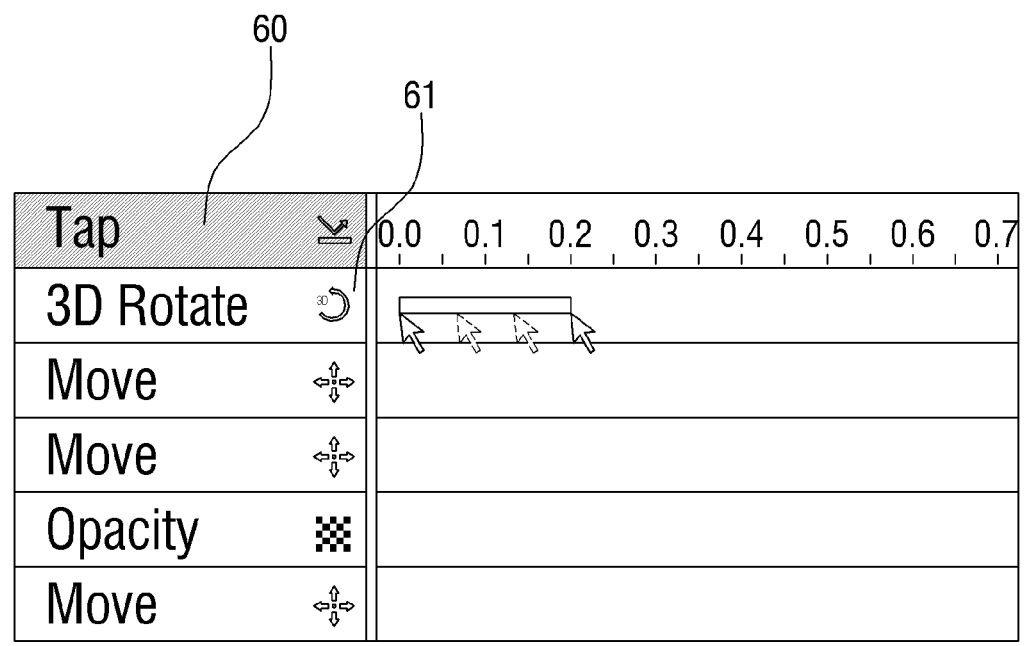
Figure 7:
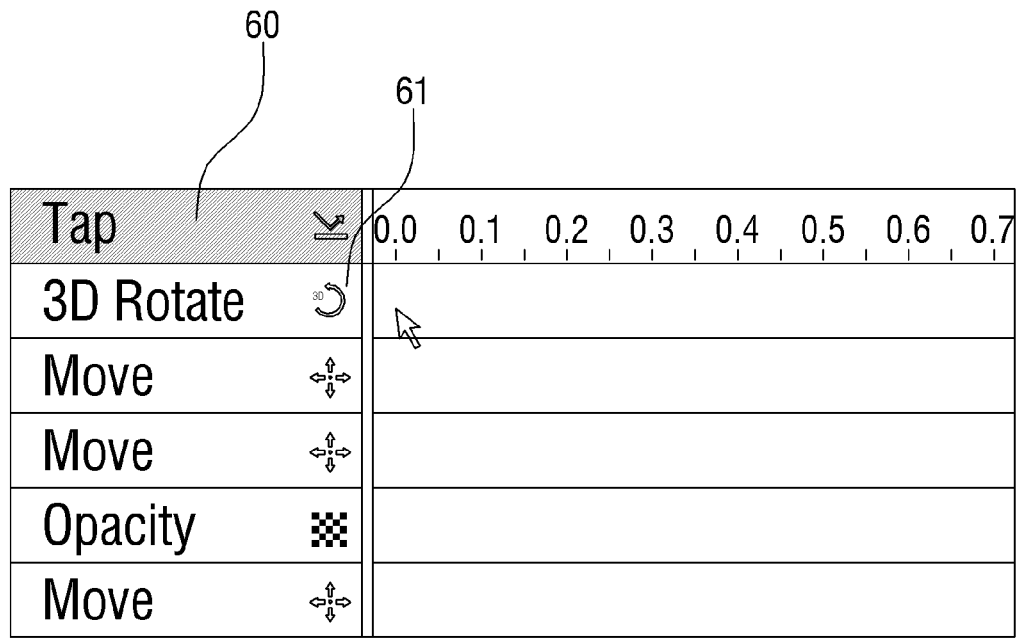
Figure 8:
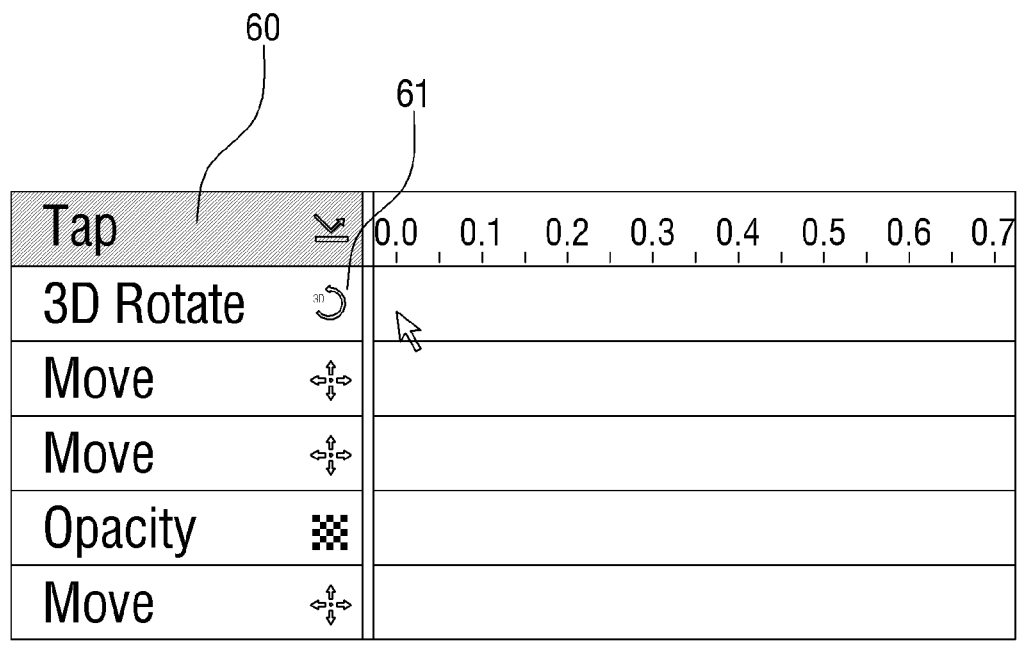

A timeline input of the 1-1st response 61 may be performed by inputting a start point and an end point. For example, as shown in FIG. 5 and FIG. 6, a start point is clicked by using input means such as a mouse (FIG. 5), and the click is dragged to an end point (FIG. 6) so as to input a timeline. Alternatively, as shown in FIG. 7 and FIG. 8, a start point is clicked by using input means such as a mouse (FIG. 7), and an end point is clicked without dragging (FIG. 8) so as to input a timeline. FIG. 5 to FIG. 8 illustrate that "3D Rotate" response of "Tap" trigger is applied from 0.0, which is a start point, to 0.2, and in this case, "3D Rotate" may be regarded as the 1-1st response 61.

When the timeline of the response 61 is input, the prototype creation terminal 10 may display the first trigger 60, the 1-1st response 61, and the timeline of the 1-1st response adjacent to each other through the prototype creation interface 40 (S250). In this case, displaying adjacent to each other may have various embodiments, but specifically, the first trigger 60, the 1-1st response 61, and the time table for inputting the timeline of the 1-1st response may be disposed adjacent to each other, thereby enabling the user to recognize the state and the timeline at a glance. For example, as shown in FIG. 4, the 1-1st response 61 may be disposed below the first trigger 60, and the time table for inputting the timeline of the 1-1st response 61 may be disposed at the right side of the 1-1st response 61. In this case, disposing the time table at the right side of the 1-1st response 61 is merely an exemplary embodiment, and the time table may be disposed at the left side, and the 1-1st response 61 may also be disposed in a pop-up format as well as below the first trigger 60.

When the timeline of the 1-1st response 61 is input apart from displaying, the prototype creation terminal 10 may apply the 1-1st response 61 to which the timeline is input, to the first layer 50 through the prototype creation interface 40 so as to generate a prototype (S260), and the prototype creation terminal 10 may transmit the generated prototype to the execution terminal 20 (S265). In this case, the user may check an operation of the generated prototype through the execution terminal 20, and may also check the operation through the prototype creation terminal 10.

The prototype creation terminal 10 may transmit the generated prototype to the server 30 rather than to the execution terminal 20 so as to upload the prototype (S268), and in this case, the user may connect to the server 30 through the execution terminal 20, download the generated prototype, and check an operation of the prototype.

In the prototype creation method according to an embodiment of the present inventive concept described so far, one 1-1st response 61 included in one first trigger 60 is applied to one first layer 50 so as to generate a prototype. However, there may exist embodiments in that a plurality of responses included in the first trigger 60 may be selected in one prototype creation terminal 10 through the prototype creation interface 40, or a plurality of triggers are selected in one prototype creation terminal 10, which will now be described.

Figure 9:
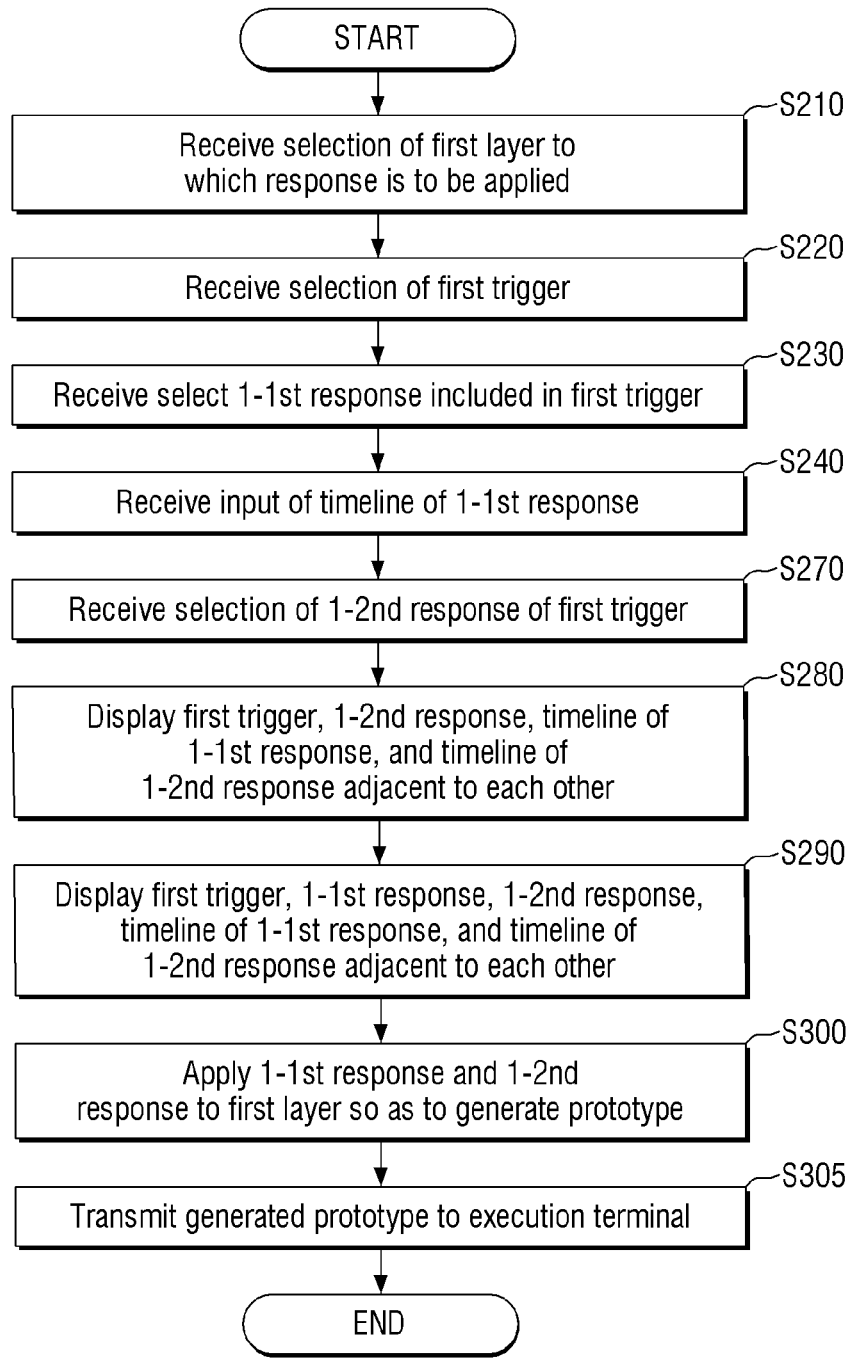
FIG. 9 is a flow diagram illustrating a prototype creation method according to another embodiment of the present inventive concept, and specifically, selecting a plurality of responses included in a first trigger.

FIG. 9 is a flow diagram illustrating a prototype creation method according to another embodiment of the present inventive concept, and specifically, selecting a plurality of responses included in the first trigger 60. However, the embodiment described with reference to FIG. 9 is merely a preferred exemplary embodiment for accomplishing the object of the present inventive concept, and a part of steps may be added or deleted as needed.

First, steps 210 to 240 are the same as those described above. That is, the first layer 50 is selected, the first trigger 60 and the 1-1st response 61 are sequentially selected, and then, the timeline of the 1-1st response 61 is input.

In the description of the step 220 above, the selected trigger may enumerate responses included therein in a vertical direction, and an additional response will be referred to as a 1-2nd response 62. That is, in the present embodiment, the 1-1st response 61 and the 1-2nd response 62 included in the first trigger 60 may be applied to the first layer 50.

When the timeline of the 1-1st response 61 is input, the 1-2nd response 62 included in the first trigger 60 may be selected in the prototype creation terminal 10 through the prototype creation interface 40 (S270). In this case, selecting the 1-2nd response 62 may be the same as selecting the 1-1st response 61 described above, and thus a detailed description thereof will be omitted to avoid duplicated description.

When the 1-2nd response 62 is selected, a timeline of the 1-2nd response 62 may be input to the prototype creation terminal 10 through the prototype creation interface 40 (S280). In this case, inputting the timeline of the 1-2nd response 62 may be the same as inputting the time of the 1-1st response 61 described above, and thus a detailed description thereof will be omitted to avoid duplicated description.

Figure 10:
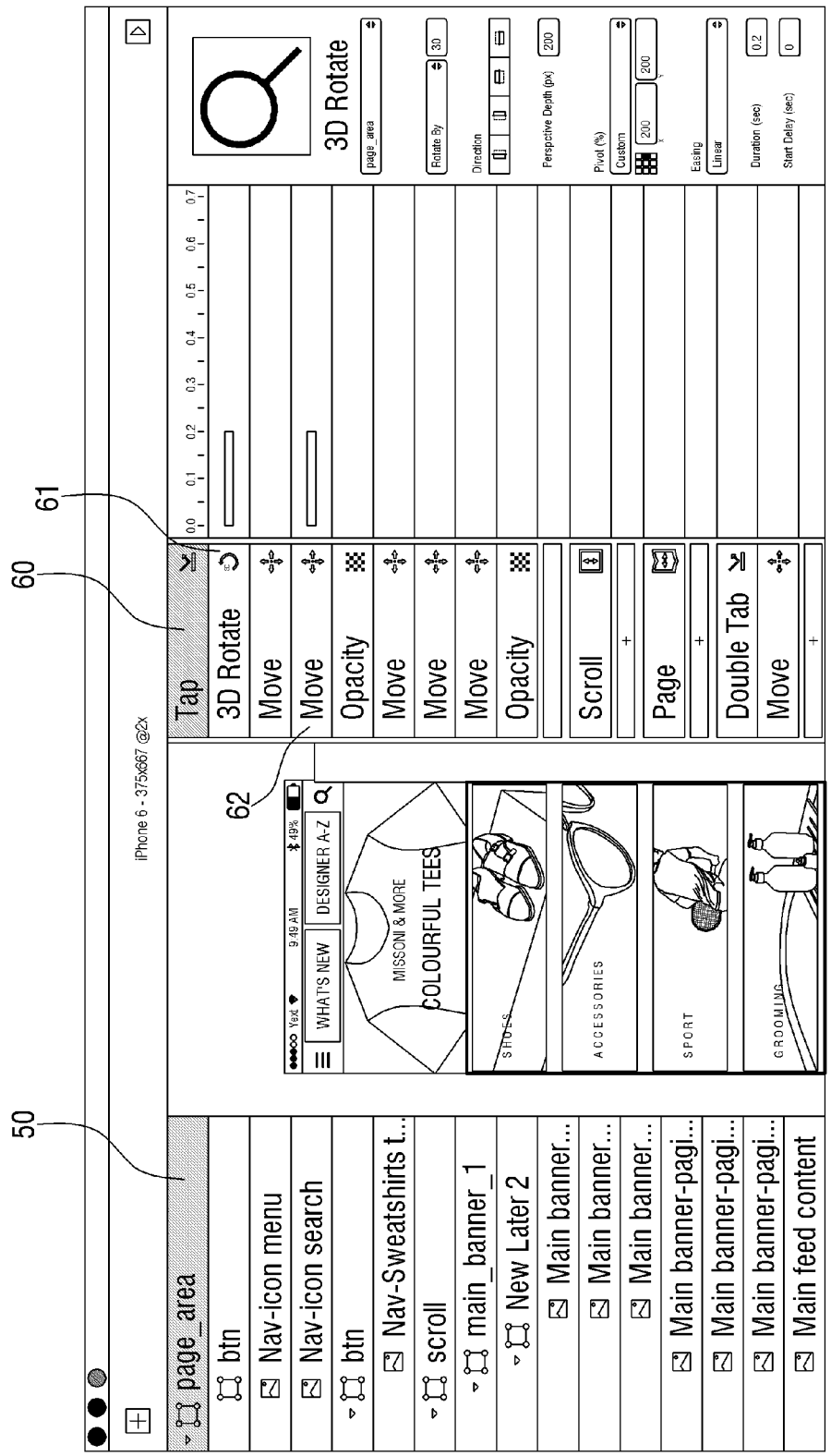
FIG. 10 illustrates selecting a 1-2nd response.

Referring to FIG. 10, a timeline is input to "Move" response, and in this case, the "Move" response may be regarded as the 1-2nd response 62.

When the timeline of the 1-2nd response 62 is input, the prototype creation terminal 10 may display the first trigger 60, the 1-1st response 61, the 1-2nd response 62, the timeline of the 1-1st response, and the time line of the 1-2nd response adjacent to each other through the prototype creation interface 40 (S290). In this case, displaying adjacent to each other may be the same as displaying the first trigger 60, the 1-1st response 61, and the timeline of the 1-1st response adjacent to each other as described above, and thus a detailed description thereof will be omitted to avoid duplicated description, but as one exemplary embodiment, the 1-1st response 61 and the 1-2nd response 62 may be disposed below the first trigger 60, and a time table for inputting the timeline of the 1-1st response 61 and the timeline of the 1-2nd response 62 may be disposed at the right side of the 1-1st response 61 and the 1-2nd response 62.

When the timeline of the 1-2nd response 62 is input apart from displaying, the prototype creation terminal 10 may apply the 1-1st response 61 and the 1-2nd response 62 to which the respective timelines are input, to the first layer 50 through the prototype creation interface 40 so as to generate a prototype (S300), and the prototype creation terminal 10 may transmit the generated prototype to the execution terminal 20 (S305). In this case, the user may check an operation of the generated prototype through the execution terminal 20, and may also check the operation through the prototype creation terminal 10. In this case, the creation and transmission of the prototype may be the same as those in the 1-1st response 61, and thus a detailed description thereof will be omitted to avoid duplicated description.

The steps S270 to S305 described above are the same as those in the 1-1st response 61, except that the 1-2nd response 62 is added. However, referring to FIG. 8, singularities may exist in that the timeline of the 1-1st response 61 and the timeline of the 1-2nd response 62 are the same. This may mean that the 1-1st response 61 and the 1-2nd response 62 are applied to the first layer 50 at the same point of time, with the result that effects of the 1-1st response 61 and the 1-2nd response 62 are simultaneously implemented. That is, referring to FIG. 10, when the user "Taps" the prototype execution terminal 20, the first layer 50 "3D Rotates" and simultaneously "Moves" during the same time. This may occur since the timeline of the 1-1st response 61 and the time line of the 1-2nd response 62 exactly overlap each other, and when the time lines partially overlap, the effects may be implemented with a time difference. For example, when the timeline of the 1-2nd response 62 is 0.1 to 0.3, "3D Rotate" may be implemented first, and then "3D Rotate" may be implemented simultaneously with "Move" from 0.1, "3D Rotate" may end at 0.2, and "Move" may be implemented to 0.3. However, when there is no overlapping timeline at all, the 1-2nd response 62 may be implemented after ending of the 1-1st response 61. That is, the timeline of the 1-1st response 61 and the time line of the 1-2nd response 62 may partially or entirely overlap, or may not overlap at all. Furthermore, since the timeline of the 1-1st response 61 and the time line of the 1-2nd response 62 may partially or entirely overlap, a response converted in the middle can be delicately adjusted when a plurality of states are converted.

Figure 11:
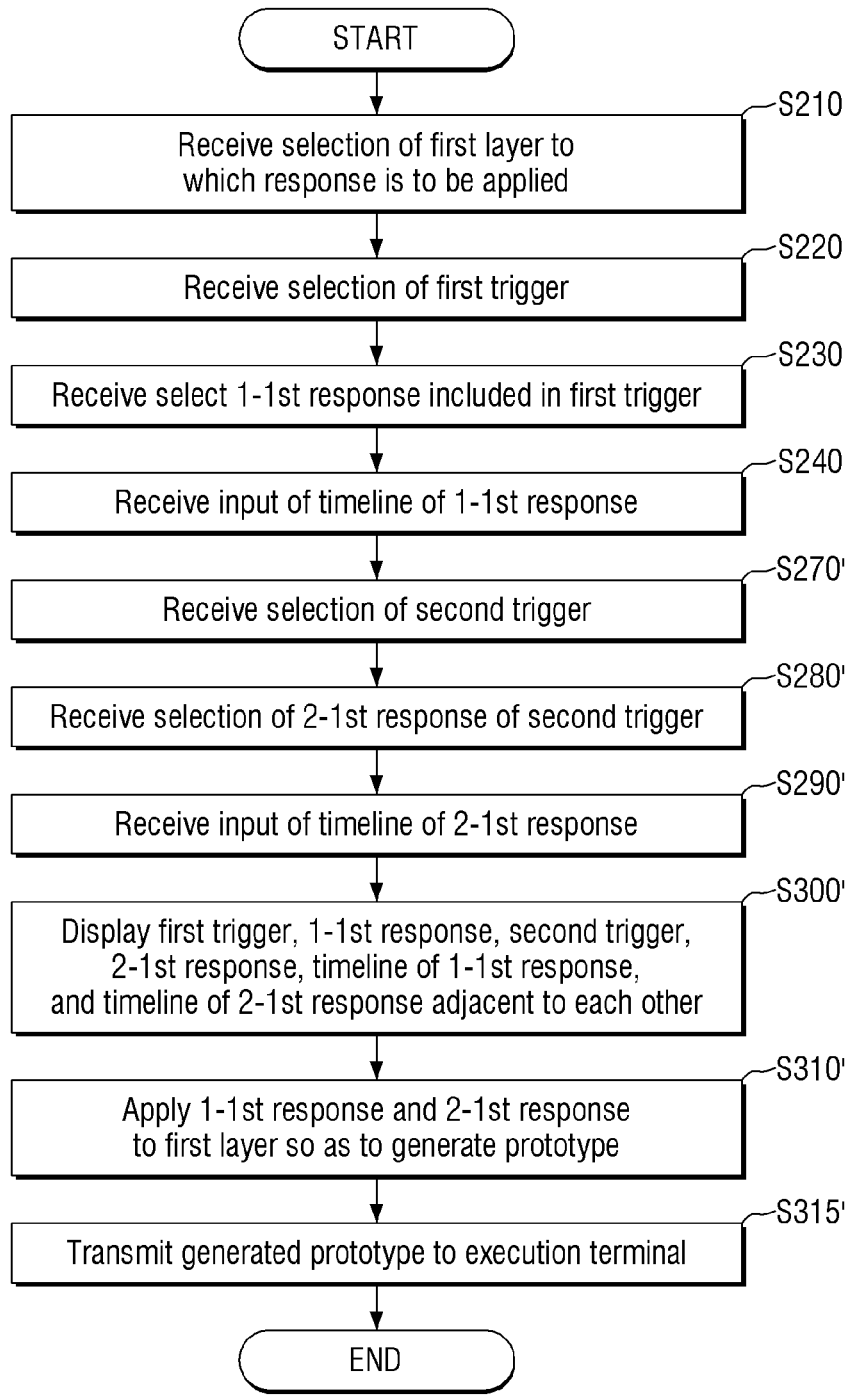
FIG. 11 is a flow diagram illustrating a prototype creation method according to still another embodiment of the present inventive concept, and specifically, selecting a plurality of triggers.

Selecting a plurality of triggers will now be described. FIG. 11 is a flow diagram illustrating a prototype creation method according to still another embodiment of the present inventive concept, and specifically, selecting a plurality of triggers. However, the embodiment described with reference to FIG. 11 is merely a preferred exemplary embodiment for accomplishing the object of the present inventive concept, and a part of steps may be added or deleted as needed.

First, steps 210 to 240 are the same as those described above. That is, the first layer 50 is selected, the first trigger 60 and the 1-1st response 61 are sequentially selected, and then, the timeline of the 1-1st response 61 is input.

Since the trigger means a condition under which the prototype execution terminal 20 outputs a specific response, the prototype creation interface 40 may have a plurality of triggers pre-defined therein, and the trigger to be further selected will be referred to as a second trigger 70. That is, in the present embodiment, the 1-1st response 61 included in the first trigger 60 and a 2-1st response 71 included in the second trigger 70 may be applied.

When the timeline of the response 61 is input, the second trigger 70 may be selected in the prototype creation terminal 10 through the prototype creation interface 40 (S270'). In this case, selecting the second trigger 70 may be the same as selecting the first trigger 60 described above, and thus a detailed description thereof will be omitted to avoid duplicated description.

When the trigger 70 is selected, the 2-1st response 71 included in the second trigger 70 may be selected in the prototype creation terminal 10 through the prototype creation interface 40 (S280'), and a timeline of the 2-1st response 71 may be input to the prototype creation terminal 10 (S290'). In this case, selecting the 2-1st response 71 and inputting the timeline thereof may also be the same as selecting the 1-1st response 61 and inputting the timeline thereof, and thus a detailed description thereof will be omitted to avoid duplicated description.

Figure 12:
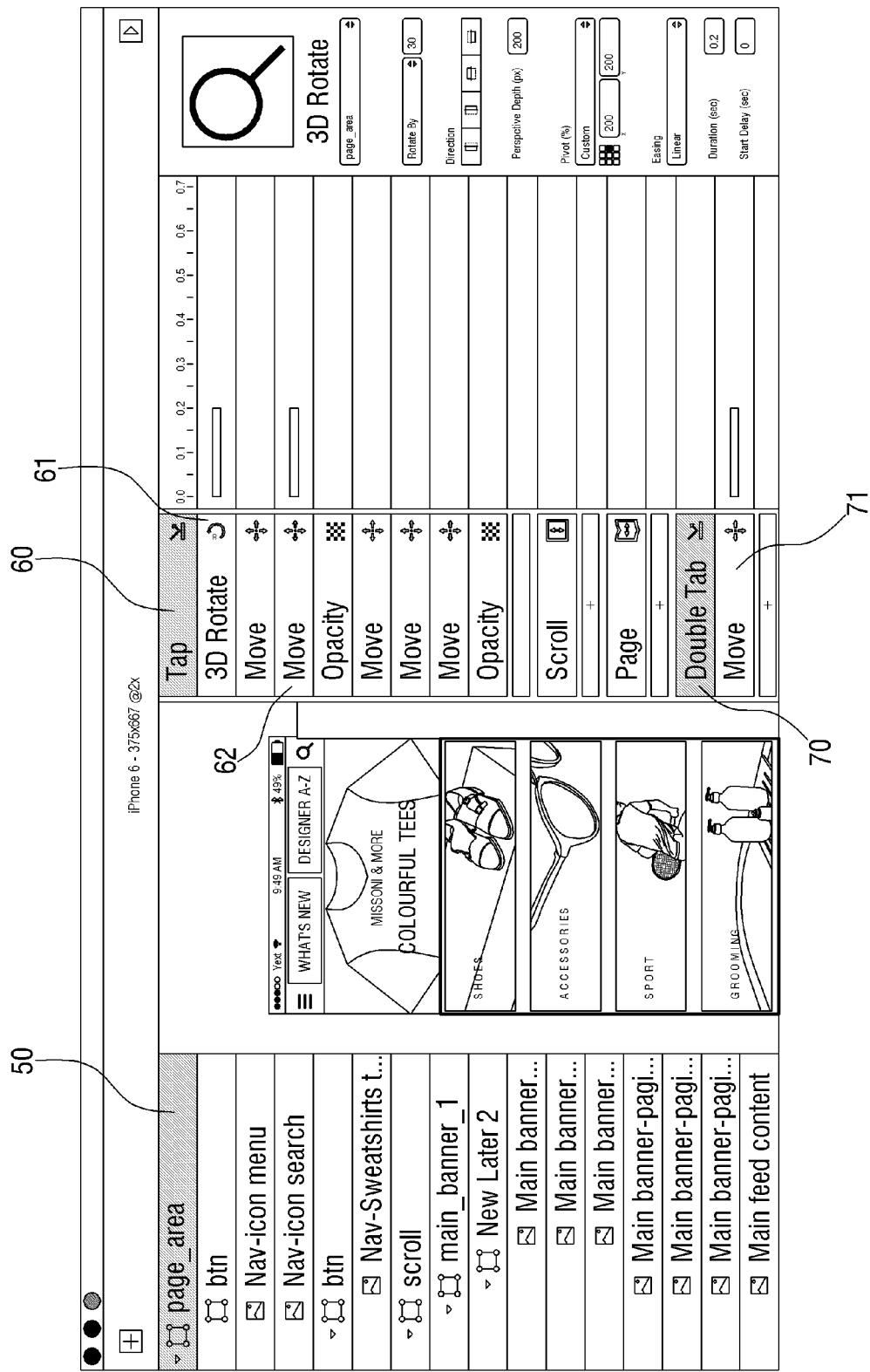
FIG. 12 illustrates selecting a second trigger and a 2-1st response.

Referring to FIG. 12, a timeline is input to "Move" response included in "Double Tap" trigger, and in this case, the "Double Tap" trigger may be regarded as the second trigger 70, and the "Move" response may be regarded as the 2-1st response 71.

When the timeline of the response 71 is input, the prototype creation terminal 10 may display the first trigger 60, the 1-1st response 61, the second trigger 70, the 2-1st response 71, the timeline of the 1-1st response, and the timeline of the 2-1st response adjacent to each other through the prototype creation interface 40 (S300'). In this case, displaying adjacent to each other may be the same as displaying the first trigger 60, the 1-1st response 61, and the timeline of the 1-1st response adjacent to each other as described above, and thus a detailed description thereof will be omitted to avoid duplicated description.

When the timeline of the 2-1st response 71 is input apart from displaying, the prototype creation terminal 10 may apply the 1-1st response 61 and the 2-1st response 71 to which the respective timelines are input, to the first layer 50 through the prototype creation interface 40 so as to generate a prototype (S310'), and the prototype creation terminal 10 may transmit the generated prototype to the execution terminal 20 (S315'). In this case, the user may check an operation of the generated prototype through the execution terminal 20, and may also check the operation through the prototype creation terminal 10. In this case, the creation and transmission of the prototype may be the same as those in the 1-1st response 61, and thus a detailed description thereof will be omitted to avoid duplicated description.

The steps S270' to S315' described above are the same as those in the first trigger 60 and the 1-1st response 61, except that the second trigger 70 and the 2-1st response 71 are added. However, referring to FIG. 12, singularities may exist in that the timeline of the 1-1st response 61 and the timeline of the 2-1st response 71 are the same. This may mean that the 1-1st response 61 and the 2-1st response 71 are applied to the first layer 50 at the same point of time according to an input of the first trigger 60 and the second trigger 70, and an effect of either the 1-1st response 61 or the 2-1st response 71 is implemented according to an input trigger. That is, referring to FIG. 12, when the user "Taps" the prototype execution terminal 20, the first layer 50 immediately "3D Rotates", and when the user "Double Taps" the prototype execution terminal 20, the first layer 50 immediately "Moves". This may occur since start points of the timeline of the 1-1st response 61 and the time line of the 2-1st response 71 are immediate (0.0) from the trigger input, and if otherwise, the effects may be implemented with a time difference. For example, when the timeline of the 1-1st response 61 is 0.0 to 0.3 and the timeline of the 2-1st response 71 is 0.1 to 0.3, "3D Rotate" may be immediately implemented to 0.3 if the prototype execution terminal 20 is "Tapped" at the point of 0.0, and "Move" may be implemented from 0.2 to 0.4 if the prototype execution terminal 20 is "Double Tapped" at the point of 0.1. That is, "3D Rotate" and "Move" may be implemented simultaneously from 02. To 0.3. That is, when the timelines of the 1-1st response 61 and the 2-1st response 71 implemented from the point of time of inputting the first trigger 60 and the second trigger 70 overlap each other, the 1-1st response 61 and the 2-1st response 71 may be processed in parallel, but a simple overlap between the timelines of the 1-1st response 61 and the 2-1st response 71 may not enable parallel processing. This is due to the dependency in which responses are implemented only when triggers are generated.

Meanwhile, the case of the second trigger 70 and the 2-1st response 71 may differ from the case where the first trigger 60 includes the 1-1st response 61 and the 1-2nd response 62.

When the first trigger 60 includes the 1-1st response 61 and the 1-2nd response 62, the 1-1st response 61 and the 1-2nd response 62 are dependent on the first trigger 60, and thus the 1-1st response 61 and the 1-2nd response 62 may be implemented when the first trigger 60 is input to the prototype execution terminal 20. However, the second trigger 70 is independent of the first trigger 60, and thus, even when the timelines of the 1-1st response 61 and the 2-1st response 71 partially or entirely overlap each other, the 2-1st response 71 may not be implemented if the second trigger 70 is not input to the prototype execution terminal 20. This is because the triggers including respective responses are independent of each other.

The present embodiment is described with reference to the case where the 2-1st response 71 included in the second trigger 70 is selected, and like the first trigger 60, the second trigger 70 may also include a plurality of responses, and like the embodiment described with reference to FIG. 9, a 2-2nd response 72 may be further selected. In this case, selecting the 2-2nd response 72 and inputting a timeline may also be the same as selecting the 1-2nd response 62 and inputting the timeline described above, thus a detailed description thereof will be omitted to avoid duplicated description.

The prototype creation methods according to various embodiments of the present inventive concept have been described so far. Specifically, various embodiments include the case where only one response included in one trigger is selected, the case where a plurality of responses included in one trigger are selected, the case where only one response included in a plurality of triggers is selected, and the case where a plurality of responses included in a plurality of triggers are selected. Specifically, a plurality of triggers and a plurality of responses can be selected so as to enable parallel processing of multiple input signals.

A prototype creation method according to one embodiment of the present inventive concept, more specifically, a prototype creation method in terms of user interface (UI) of a prototype creation interface will now be described.

Figure 13:
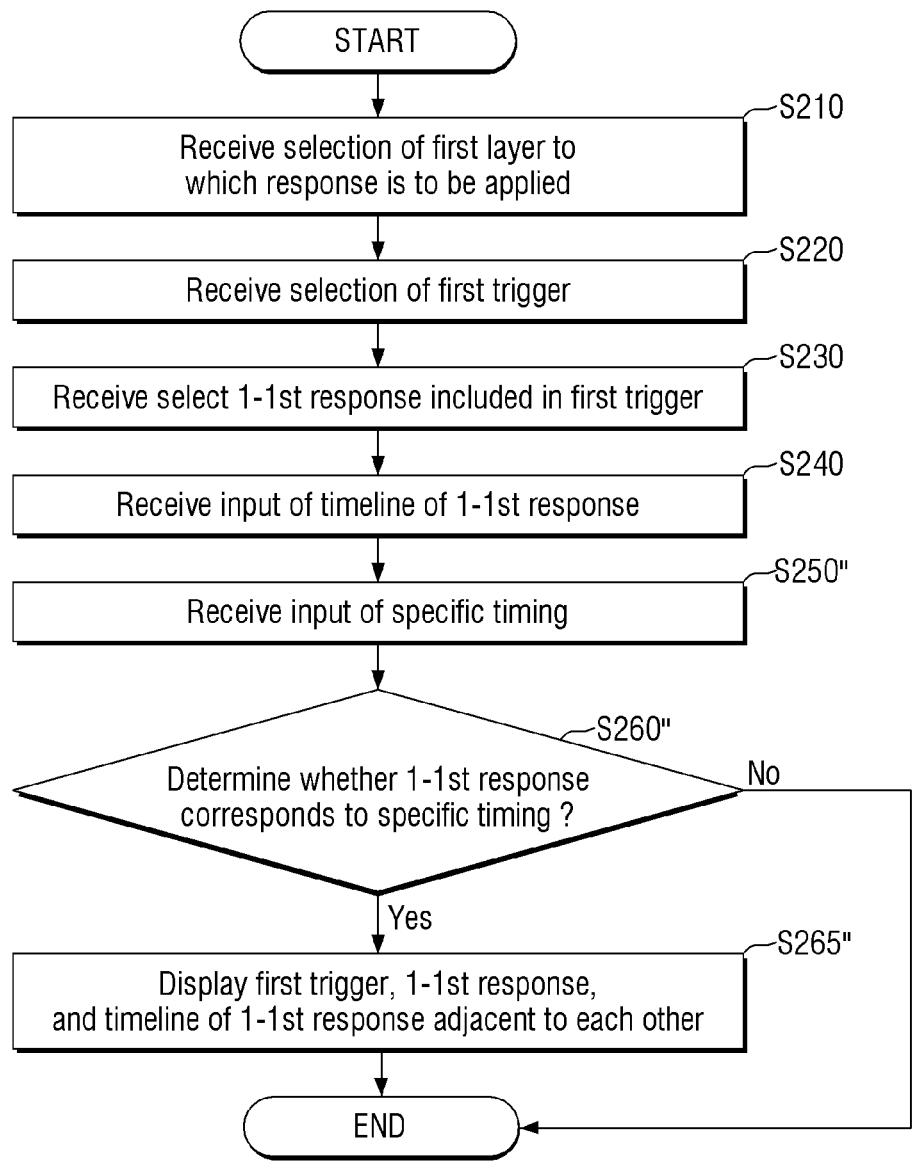
FIG. 13 is a flow diagram illustrating a prototype creation method according to still another embodiment of the present inventive concept, and specifically, outputting a response matched to specific timing.

FIG. 13 is a flow diagram illustrating a prototype creation method according to still another embodiment of the present inventive concept, and specifically, outputting a response matched to specific timing. However, the embodiment described with reference to FIG. 13 is merely a preferred exemplary embodiment for accomplishing the object of the present inventive concept, and a part of steps may be added or deleted as needed.

First, steps 210 to 240 are the same as those described above. That is, the first layer 50 is selected, the first trigger 60 and the 1-1st response 61 are sequentially selected, and then, the timeline of the 1-1st response 61 is input.

When the timeline of the response is input, specific timing is input to the prototype creation terminal 10 through the prototype creation interface 40 (S250"). In this case, the specific timing may be on point on a time table.

When the specific timing is input, the prototype creation terminal 10 may determine whether the 1-1st response 61 corresponds to the specific timing through the prototype creation interface 40 (S260"), and if it is determined that the 1-1st response 61 corresponds to the specific timing, the prototype creation terminal 10 may highlight-display the selected first trigger 60, the 1-1st response 61, and the timeline of the 1-1st response 61 adjacent to each other (S265"). If it is determined that the 1-1st response 61 does not correspond to the specific timing, none of them may be displayed.

Figure 14:
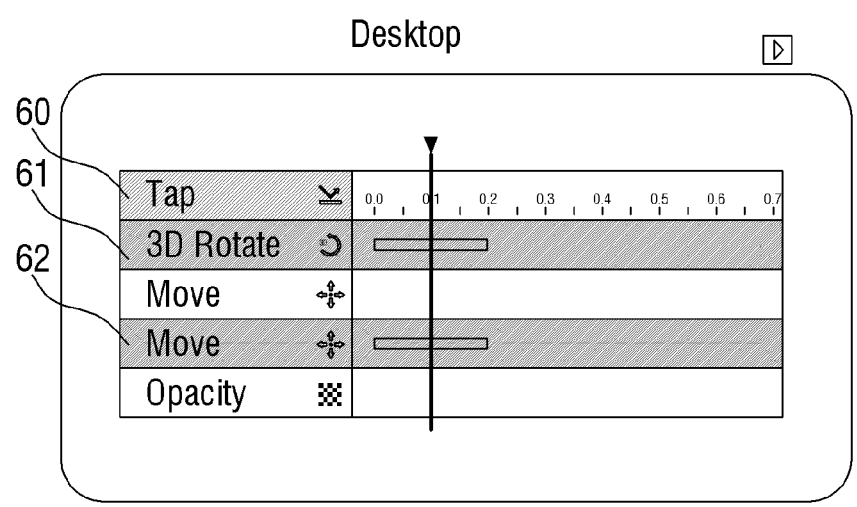
FIG. 14 illustrates outputting responses matched to specific timing.

Referring to FIG. 14, "3D ROTATE" and "MOVE" responses corresponding to specific timing 0.2 may be highlight-displayed, and the residual responses may be displayed transparent. The prototype creation interface 40 may never display responses which do not correspond to specific timing. In this case, only responses corresponding to specific timing may be implemented in the prototype execution terminal 20. Thus, only responses corresponding to specific timing and timelines thereof, and triggers are displayed, such that the user may refer to the displayed matter when inputting timelines of responses, making prototype designing convenient.

Furthermore, specific timing may move rightward on a time table when a specific timing reproduction command is input, and in this case, responses which sequentially correspond as the specific timing moves may be highlight-displayed. For example, if specific timing is 0.0, the timeline of the 1-1st response 61 is 0.1 to 0.3, and the timeline of the 1-2nd response 62 is 0.4 to 0.5, the 1-1st response 61 and the timeline of the 1-1st response 61 may be highlight-displayed from 0.1 to 0.3, and the 1-2nd response 62 and the timeline of the 1-2nd response 62 may be highlight-displayed from 0.4 to 0.5, while the specific timing moves rightward by an input reproduction command. In this case, from 0.4 to 0.5, the 1-1st response 61 and the timeline of the 1-1st response 61 may be processed to be transparent, or displayed in highlight different from the highlight of the 1-2nd response 62 and the timeline of the 1-2nd response 62.

When the timeline of the 1-1st response 61 is input, OFF command of the first trigger 60 is input to the prototype creation terminal 10 through the prototype creation interface 40 (S255'), and the prototype creation terminal 10 may turn off the 1-1st response 61 (S258'). The response is dependent on the trigger, and thus, if the trigger may be turned off, the response included in the trigger may also be turned off, and any specific response can be turned off separately.

The triggers, responses, outputting of timelines of responses, outputting after determining whether to correspond to specific timing, turning off of the triggers and responses have been described so far based on the first layer 50, but the prototype creation method according to an embodiment of the present inventive concept may also be applied to a plurality of layers, and thus these elements may also be applied to a plurality of layers. For example, responses output in correspondence to specific timing may be those applied to layers different from each other, and two or more of a trigger, a response, and a timeline of the response applied to a specific layer may be simultaneously output.

Figure 15:
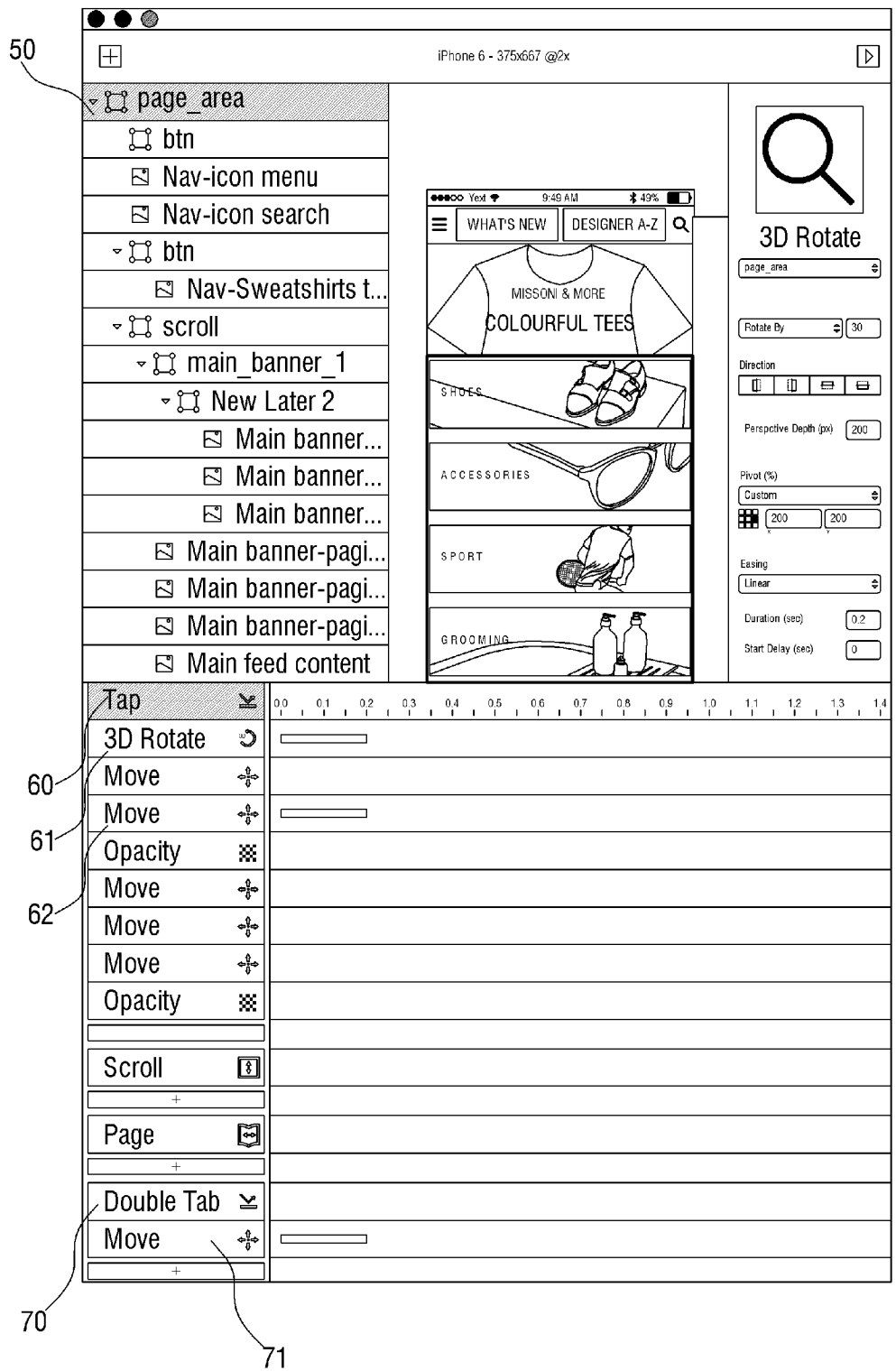
FIG. 15 illustrates a changed layout of a prototype creation interface.

Meanwhile, as an additional function of the prototype creation interface 40, a layout may be changed. Specifically, as shown in FIG. 15, the trigger and time table may be moved from the right side of the screen to the bottom of the screen. This layout emphasizes the time table, and may be used when a longer timeline is needed.

What is claimed is:

1. A prototype of graphical user interface (GUI) application creation method comprising:
   receiving, through a prototype creation interface of a prototype creation terminal, a selection of a title of a first layer from a list of titles of plurality of layers displayed in the prototype creation interface;
   receiving a selection of a first trigger through the prototype creation interface, which triggers an output of a specific response to be displayed in a prototype execution terminal, wherein the first trigger is displayed with information of a first action to be recognized as a triggering input;
   receiving a selection of a 1-1st response of the first trigger through the prototype creation interface, wherein the 1-1st response is an output to the first layer driven by the prototype execution terminal when the first trigger is initiated by a user of the prototype execution terminal;
   receiving an input of a timeline of the 1-1st response through the prototype creation interface;
   receiving a selection of a second trigger through the prototype creation interface, wherein the second trigger is displayed with information of a second action to be recognized as a triggering input;
   receiving a selection of a 2-1st response of the second trigger through the prototype creation interface, wherein the 2-1st response is an output to the first layer driven by the prototype execution terminal when the second trigger is initiated by the user of the prototype execution terminal;
   receiving an input of timeline of the 2-1st response through the prototype creation interface;
   in response to receiving the input of timeline of the 1-1st and 2-1st response, generating a prototype, by applying 1-1st response and 2-1st response to which the timeline is input, to the first layer through the prototype creation interface;
   displaying the list of titles of plurality of layers, the first trigger, plurality of responses associated with first trigger including the 1-1st response, the timeline of the 1-1st response, the second trigger, plurality of responses associated with second trigger including the 2-1st response, and the timeline of the 2-1 response adjacent to each other through the prototype creation interface, and displaying the first layer which is a preview image of the GUI application to which the 1-1st response and the 2-1 response is applied, with the adjacently displayed list of titles, first trigger, plurality of responses associated with first trigger including 1-1st response, timeline of the 1-1st response, second trigger, plurality of responses associated with second trigger including 2-1 response, and the timeline of the 2-1 response, simultaneously in one screen;
   transmitting, by a prototype creation terminal, the generated prototype to the prototype execution terminal; and
   executing, by the prototype execution terminal, the transmitted prototype to be displayed on the prototype execution terminal.

2. The method of claim 1, wherein the receiving the input of the timeline of the 1-1st response comprises receiving inputs of a start point and an end point of the 1-1st response.

3. The method of claim 1, further comprising, after the receiving the input of the timeline of the 1-1st response:
   receiving a selection of a 1-2nd response of the first trigger; and
   receiving an input of a timeline of the 1-2nd response, and wherein the firstly displaying comprises secondly displaying the first trigger, the 1-1st response, the 1-2nd response, the timeline of the 1-1st response, and the timeline of the 1-2nd response adjacent to each other.

4. The method of claim 3, wherein the secondly displaying comprises disposing the 1-1st response and the 1-2nd response adjacent to the first trigger, and disposing a time table for inputting the timeline of the 1-1st response and the timeline of the 1-2nd response adjacent to the 1-1st response and the 1-2nd response.

5. The method of claim 3, wherein the timeline of the 1-1st response and the timeline of the 1-2nd response partially or entirely overlap so as to process the 1-1st response and the 1-2nd response in parallel.

6. The method of claim 1, wherein, when the timelines of the 1-1st response and the 2-1st response which are implemented from a point of time of received the first trigger and the second trigger to the prototype execution terminal are partially or entirely overlapped, the 1-1st response and the 2-1st response are processed in parallel.

7. The method of claim 1, further comprising, after the receiving the input of the timeline of the 1-1st response:
receiving an input of specific timing; and
determining whether the 1-1st response corresponds to the received specific timing.

8. The method of claim 7, further comprising, after the determining whether the 1-1st response corresponds to the received specific timing, when it is determined that the 1-1st response corresponds to the specific timing,
highlight-displaying the first trigger, the 1-1st response, and the timeline of the 1-1st response adjacent to each other.

9. The method of claim 1, further comprising, after the receiving the input of the timeline of the 1-1st response:
receiving an input of OFF command of the first trigger; and
turning OFF the 1-1st response.

10. A computer program coupled to a computing device to execute a prototype of graphical user interface (GUI) application creation method and stored in a non-transitory computer readable recording medium, the program being configured to execute:
an operation of receiving, through a prototype creation interface of a prototype creation terminal, a selection of a title of a first layer from a list of titles of plurality of layers displayed in the prototype creation interface;
an operation of receiving a selection of a first trigger through the prototype creation interface, which triggers an output of a specific response to be displayed in a prototype execution terminal, wherein the first trigger is displayed with information of a first action to be recognized as a triggering input;
an operation of receiving a selection of a 1-1st response of the first trigger through the prototype creation interface, wherein the 1-1st response is an output to a first layer driven by the prototype execution terminal when the first trigger is initiated by a user of the prototype execution terminal;
an operation of receiving an input of a timeline of the 1-1st response through the prototype creation interface;
an operation of receiving a selection of a second trigger through the prototype creation interface, wherein the second trigger is displayed with information of a second action to be recognized as a triggering input;
an operation of receiving a selection of a 2-1st response of the second trigger through the prototype creation interface, wherein the 2-1st response is an output to the first layer driven by the prototype execution terminal when the second trigger is initiated by the user of the prototype execution terminal;
an operation of receiving an input of timeline of the 2-1st response through the prototype creation interface;
an operation of, in response to receiving the input of timeline of the 1-1st and 2-1st response, generating a prototype, by applying 1-1st response and 2-1st response to which the timeline is input, to the first layer through the prototype creation interface;
an operation of displaying the list of titles of plurality of layers, the first trigger, plurality of responses associated with first trigger including the 1-1st response, the timeline of the 1-1st response, the second trigger, plurality of responses associated with second trigger including the 2-1st response, and the timeline of the 2-1 response adjacent to each other through the prototype creation interface, and displaying the first layer which is a preview image of the GUI application to which the 1-1st response and the 2-1 response is applied, with the adjacently displayed list of titles, first trigger, plurality of responses associated with first trigger including 1-1st response, timeline of the 1-1st response, second trigger, plurality of responses associated with second trigger including 2-1 response, and the timeline of the 2-1 response, simultaneously in one screen; and
an operation of transmitting the generated prototype to the prototype execution terminal to have the prototype execution terminal displayed the transmitted prototype on the prototype execution terminal.

11. The method of claim 1, wherein the displaying the first trigger comprises further displaying selectable responses for the first trigger, selectable timelines for the selectable responses, adjacent to the first trigger.

12. The method of claim 1, further comprises, prior to the receiving the selection of the first trigger,
providing the prototype creation interface including a plurality of selectable triggers, a plurality of selectable responses for each selectable trigger and selectable timelines for the selectable responses, wherein the each selectable trigger is displayed with the information of the action to be recognized as the triggering input.

* * * * *